United States Patent
Lee et al.

(10) Patent No.: US 10,268,298 B2
(45) Date of Patent: *Apr. 23, 2019

(54) MUTUAL-CAPACITANCE TOUCH APPARATUS AND HIGHLY SENSITIVE MUTUAL-CAPACITANCE TOUCH SENSING METHOD FOR THE SAME

(71) Applicant: SUPERC-TOUCH CORPORATION, New Taipei (TW)

(72) Inventors: Hsiang-Yu Lee, New Taipei (TW);
Shang Chin, New Taipei (TW);
Ping-Tsun Lin, New Taipei (TW);
Chia-Hsun Tu, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/588,677

(22) Filed: May 7, 2017

(65) Prior Publication Data

US 2018/0321762 A1 Nov. 8, 2018

(51) Int. Cl.
*G06F 3/041* (2006.01)
*G06F 3/044* (2006.01)
*H01L 27/32* (2006.01)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ...... G06F 3/044; G06F 3/0412; G06F 3/0416; G06F 2203/04107; G06F 3/0418;
(Continued)

(56) References Cited

U.S. PATENT DOCUMENTS 5,847,690 A * 12/1998 Boie .................... G06F 3/0412
345/104
9,405,416 B2    8/2016 Kang
(Continued)

FOREIGN PATENT DOCUMENTS

CN          205176820 U  *  4/2016  ............. G06F 3/044
TW          201316235 A      4/2013
(Continued)

OTHER PUBLICATIONS

Office Action dated Aug. 23, 2018 of the corresponding Taiwan patent application.

*Primary Examiner* — Patrick F Marinelli
(74) *Attorney, Agent, or Firm* — Chun-Ming Shih; HDLS IPR Services

(57) ABSTRACT

A mutual-capacitance touch apparatus and highly sensitive mutual-capacitance touch sensing method thereof, the method includes: providing a touch apparatus including: a plurality of first touch electrodes and a plurality of second touch electrodes, a touch controller including a touch driving signal generator, a touch receiver, and an amplifier with gain larger than zero. The touch controller sequentially or randomly applies a touch driving signal to a selected first touch electrode, and senses a touch sensing signal at a second touch electrode by the touch receiver, and processes the touch sensing signal by the amplifier with gain larger than zero, then outputs the processed touch sensing signal to at least a conductor close to the second touch electrode.

16 Claims, 13 Drawing Sheets

(52) U.S. Cl.
CPC .. *G06F 2203/04107* (2013.01); *H01L 27/323* (2013.01); *H01L 27/3262* (2013.01)

(58) Field of Classification Search
CPC .. G09G 3/2092; G09G 3/3225; G09G 3/3648; G02F 1/1368; G02F 1/13338; H01L 27/323; H01L 27/3262
See application file for complete search history.

(56) References Cited

U.S. PATENT DOCUMENTS

| | | | | |
|---|---|---|---|---|
| 9,965,119 B2* | 5/2018 | Lee | | G06F 3/044 |
| 9,977,526 B1* | 5/2018 | Lee | | G06F 3/0412 |
| 10,120,476 B1* | 11/2018 | Lee | | G06F 3/0412 |
| 2005/0225233 A1* | 10/2005 | Boroson | | H01L 27/322 |
| | | | | 313/504 |
| 2007/0216657 A1* | 9/2007 | Konicek | | G06F 3/0412 |
| | | | | 345/173 |
| 2009/0009485 A1* | 1/2009 | Bytheway | | G06F 3/044 |
| | | | | 345/174 |
| 2010/0110038 A1* | 5/2010 | Mo | | G06F 3/044 |
| | | | | 345/174 |
| 2010/0136868 A1* | 6/2010 | Chien | | G06F 3/0412 |
| | | | | 445/24 |
| 2010/0220071 A1* | 9/2010 | Nishihara | | G06F 3/0416 |
| | | | | 345/173 |
| 2011/0273399 A1* | 11/2011 | Lee | | G06F 3/0418 |
| | | | | 345/174 |
| 2012/0050214 A1* | 3/2012 | Kremin | | G06F 3/0418 |
| | | | | 345/174 |
| 2012/0206395 A1* | 8/2012 | Misaki | | G06F 3/0412 |
| | | | | 345/173 |
| 2013/0063395 A1* | 3/2013 | Byun | | G06F 3/044 |
| | | | | 345/174 |
| 2014/0042406 A1* | 2/2014 | Degner | | H01L 27/326 |
| | | | | 257/40 |
| 2015/0091849 A1* | 4/2015 | Ludden | | G06F 3/0412 |
| | | | | 345/174 |
| 2015/0268778 A1* | 9/2015 | Okamura | | G06F 3/0412 |
| | | | | 345/173 |
| 2016/0231837 A1* | 8/2016 | Baek | | G06F 3/044 |
| 2017/0357364 A1* | 12/2017 | Lee | | G06F 3/0416 |
| 2017/0357366 A1* | 12/2017 | Lee | | G06F 3/0416 |
| 2018/0074629 A1* | 3/2018 | Lee | | G02F 1/13338 |
| 2018/0292930 A1* | 10/2018 | Lee | | G06F 3/044 |
| 2018/0321762 A1* | 11/2018 | Lee | | G06F 3/044 |
| 2018/0321777 A1* | 11/2018 | Lee | | G06F 3/0412 |
| 2018/0321778 A1* | 11/2018 | Lee | | G06F 3/0412 |

FOREIGN PATENT DOCUMENTS

| | | |
|---|---|---|
| TW | 201537442 A | 10/2015 |
| TW | M533773 U | 12/2016 |
| TW | M537257 U | 2/2017 |

* cited by examiner

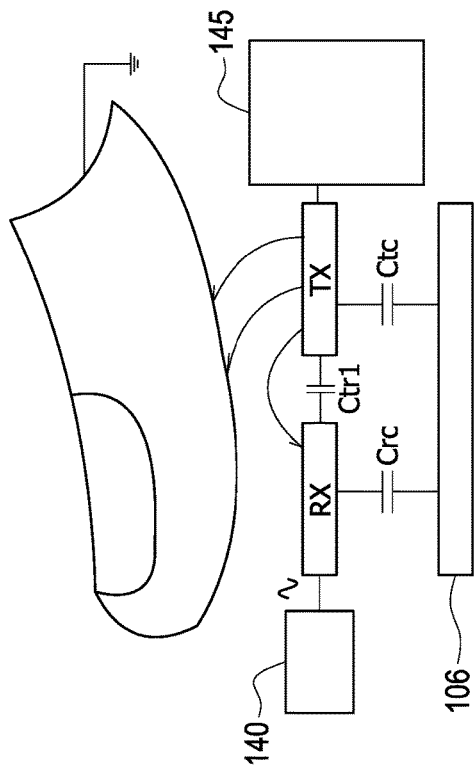
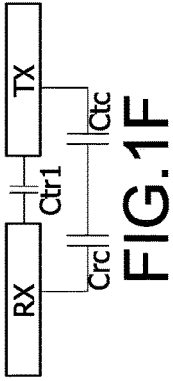
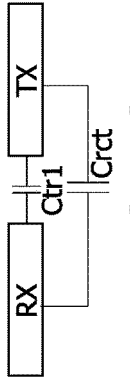
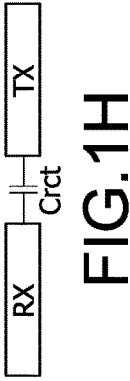
FIG.1E  FIG.1F  FIG.1G  FIG.1H
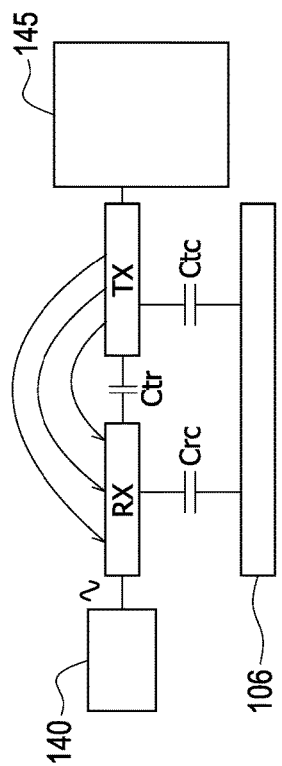
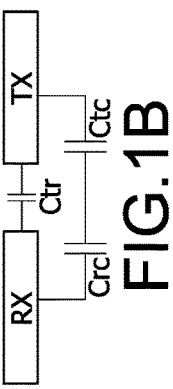
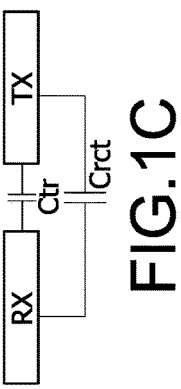
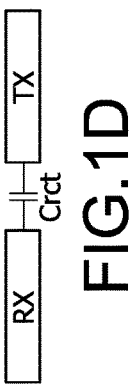
FIG.1A  FIG.1B  FIG.1C  FIG.1D

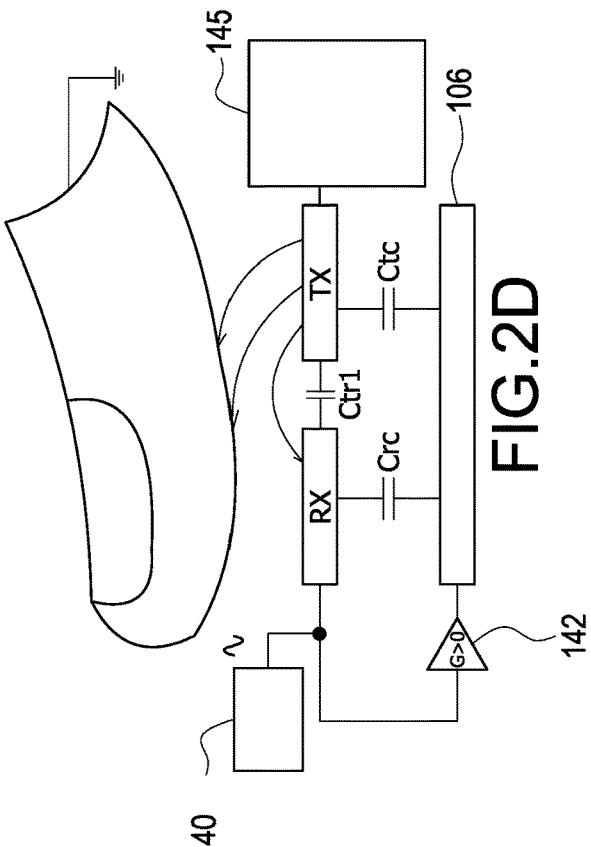
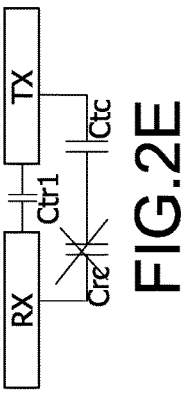
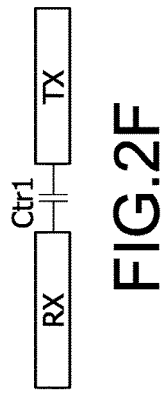
FIG.2D  FIG.2E  FIG.2F
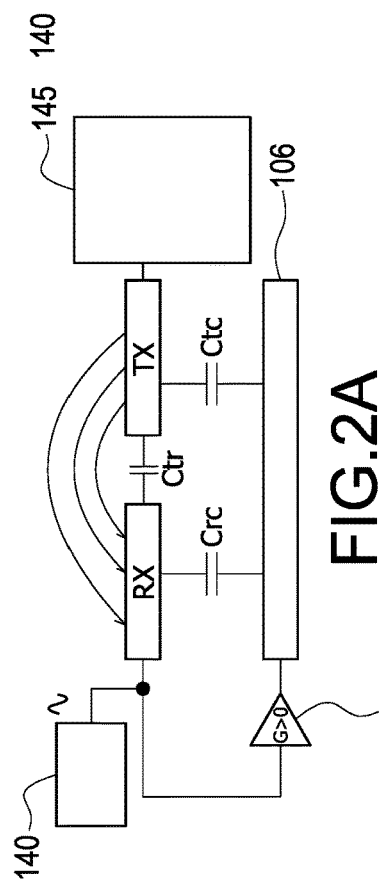
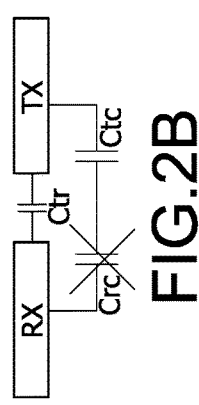
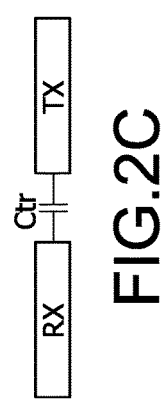
FIG.2A  FIG.2B  FIG.2C

MUTUAL-CAPACITANCE TOUCH APPARATUS AND HIGHLY SENSITIVE MUTUAL-CAPACITANCE TOUCH SENSING METHOD FOR THE SAME

BACKGROUND OF THE INVENTION

Field of the Invention

The present invention relates to a touch apparatus and touch sensing method thereof, especially to a mutual-capacitance touch apparatus and highly sensitive mutual-capacitance touch sensing method thereof.

Description of Prior Art

To replace heavy cathode tube display, there comes panel display like liquid crystal display, plasma display and organic light emitting diode display, etc. Touch display panel develops with popular mobile device, and mobile electronic device grows lighter and thinner, thus embedded touch display panel becomes popular quickly. However, there is large background stray capacitance due to small separation between touch electrode and common voltage electrode of liquid crystal panel (or common cathode/common anode of OLED panel), if the touch electrode is embedded in panel structure. Therefore, this discourages the use of mutual capacitance touch scheme with advantages of fewer lines, easy multi-points detection, and simple circuit. Thus, it is needed to overcome difficulty of sensing change of touch mutual-capacitance under large background stray capacitance, and removing large noise from the background stray capacitance.

SUMMARY OF THE INVENTION

Accordingly, the present invention is directed to provide a highly sensitive mutual-capacitance touch sensing method.

According to an embodiment of the present invention, a highly sensitive mutual-capacitance touch sensing method effectively suppressing stray capacitance surrounding is disclosed, the mutual-capacitance touch method includes: (a) providing a touch apparatus, the touch apparatus including: a plurality of first touch electrodes arranged along a first direction, a plurality of second touch electrodes arranged along a second direction, wherein the first direction is different from the second direction; and a touch controller including: a touch driving signal generator; a touch receiver; and an amplifier with gain larger than zero; and (b) the touch controller sequentially or randomly applying a touch driving signal to a selected first touch electrode, and sensing a touch sensing signal at a second touch electrode by the touch receiver, and processing the touch sensing signal by the amplifier with gain larger than zero, then outputting the processed touch sensing signal to at least a conductor close to the second touch electrode.

According to another embodiment of the present invention, a highly sensitive mutual-capacitance touch sensing method effectively suppressing stray capacitance surrounding is disclosed, the mutual-capacitance touch method includes: (a) providing a touch display apparatus, the touch display apparatus including: a plurality of first touch electrodes arranged along a first direction; a plurality of second touch electrodes arranged along a second direction, wherein the first direction is different from the second direction; a transistor substrate; a thin film transistor layer comprising a plurality of thin film transistors, a plurality of data lines and a plurality of gate lines; a plurality of pixel electrodes electrically connected to the thin film transistor; a display material layer being arranged on a side of the plurality of pixel electrodes, the side being opposite to the transistor substrate; at least a common electrode; a display controller comprising a display power source; a touch controller comprising: a touch power source; a touch driving signal generator generating a touch driving signal; and a touch receiver and an amplifier with gain larger than zero; (b) the touch controller sequentially or randomly applying the touch driving signal to a selected first touch electrode, and sensing a touch sensing signal at a second touch electrode by the touch receiver, and processing the touch sensing signal by the amplifier with gain larger than zero, then outputting the processed touch sensing signal to a reference point of the display controller or to the common electrode layer, wherein the display controller and the touch controller have no common current loop therebetween during touch sensing operation.

According to still another embodiment of the present invention, a mutual-capacitance touch display apparatus is disclosed, the mutual-capacitance touch display apparatus includes a plurality of first touch electrodes arranged along a first direction; a plurality of second touch electrodes arranged along a second direction, wherein the first direction is different from the second direction; a transistor substrate; a thin film transistor layer including a plurality of thin film transistors, a plurality of data lines and a plurality of gate lines; a plurality of pixel electrode being electrically connected to the thin film transistor; a display material layer being arranged on a side of the plurality of pixel electrodes, the side being opposite to the transistor substrate; and a common electrode layer; a display controller including a display power source; a touch controller including: a touch power source; a touch driving signal generator generating a touch driving signal; and a touch receiver and an amplifier with gain larger than zero. The touch controller sequentially or randomly applies the touch driving signal to a selected first touch electrode, and senses a touch sensing signal at a second touch electrode by the touch receiver, and processes the touch sensing signal by the amplifier with gain larger than zero, then outputs the processed touch sensing signal to a reference point of the display controller or to the common electrode.

BRIEF DESCRIPTION OF DRAWING

One or more embodiments of the present disclosure are illustrated by way of example and not limitation in the figures of the accompanying drawings, in which like references indicate similar elements. These drawings are not necessarily drawn to scale.

FIGS. 1A-1H show schematic views of mutual-capacitance touch sensing of related art.

FIGS. 2A-2F show schematic views of the highly sensitive mutual-capacitance touch sensing of the present invention.

DETAILED DESCRIPTION OF THE INVENTION

Figure 3A:
FIGS. 3A-3C show stack diagrams of touch display apparatuses adopting the highly sensitive mutual-capacitance touch sensing method of the present invention.

Please refer to FIGS. 1A-1D, showing schematic views of mutual-capacitance touch sensing of related art, where user has not touch the mutual-capacitance touch device by finger. A shown in FIG. 1A, the mutual-capacitance touch device includes a touch receiver 140, a touch driving signal generator 145, a plurality of first touch electrodes (also called touch driving electrode, as a touch driving electrode TX shown in this diagram), a plurality of second touch electrodes (also called touch sensing electrode, such as a touch sensing electrode RX shown in this diagram), and a common electrode 106 (for example, a common electrode of liquid crystal panel or common cathode/common anode of OLED panel). The shown example only describes operation of the mutual-capacitance touch device; the mutual-capacitance touch device further includes other elements for touching or displaying. After the touch driving signal generator 145 transmits the touch driving signal to the touch driving electrode TX, electric flux lines of the touch driving electrode TX is coupled to a corresponding touch sensing electrode RX, thus there is a sensing capacitance Ctr between the touch driving electrode TX and the corresponding touch sensing electrode RX. Moreover, there is a background stray capacitance Ctc between the touch driving electrode Tx and the common electrode 106, and there is a background stray capacitance Crc between the touch sensing electrode Rx and the common electrode 106. In an embedded touch display device, the touch electrode is very close to the common electrode (or common cathode/common anode of OLED panel) of the liquid crystal panel, resulting in large capacitance e of the background stray capacitance Ctc, Crc. As shown in FIG. 1B, the touch driving electrode TX and touch sensing electrode RX are electrically connected to the common electrode 106 via the background stray capacitance, the background stray capacitance Ctc, Crc can be regarded as being connected in series, thus can be represented by equivalent stray capacitance Crct shown in FIG. 1C. Because a capacitance value of the equivalent stray capacitance Crct is much larger than that of the capacitance Ctr, equivalently, there is only the equivalent stray capacitance Crct (as shown in FIG. 1D) after capacitance Ctr being connected in parallel with the stray capacitance Crct. In other words, because the background stray capacitance Crct is too large, variation of the capacitance Ctr is not easy to sense.

Refer to FIGS. 1E-1H, FIGS. 1E-1H show schematic views of mutual-capacitance touch sensing of related art, where the user has touched the mutual-capacitance touch device by finger. As shown in FIG. 1E, after the user touches the touch driving electrode TX by finger, the electric flux lines from the driving electrode to the sensing electrode is decrease, and the sensing capacitance Ctr becomes the touch sensing capacitance Ctrl. The variation of the capacitance is very small for the finger touching, thus the capacitance value of the touch sensing capacitance Ctrl is very close to that of sensing capacitance Ctr. Refer to FIGS. 1F-1H, and together with FIGS. 1B-1D, because capacitance values of background stray capacitance Ctc, Crc are much larger than that of the sensing capacitance Ctr (much larger than that of touch sensing capacitance Ctrl), in embedded architecture, it is hard for the mutual-capacitance touch sensing technology of related art to sense the capacitance variation resulted from finger touching.

Refer to FIG. 2A-2C, FIGS. 2A-2C show schematic views of mutual-capacitance touch sensing of the present invention, where the user has not touch the mutual-capacitance touch device by finger. As shown in FIG. 2A, based on the present invention, an amplifier (non-inverting amplifier) 142 with a gain larger than zero is additionally arranged in the touch receiver 140. After the touch sensing signal VRX is amplified by the amplifier 142 with a gain larger than zero, the signal resulted from the touch sensing signal VRX is outputted to an adjacent conductor close to the touch sensing electrode RX (for example, the adjacent conductor may be the common electrode 106). Because the touch sensing signal VRX is amplified without inverting (for example, the gain is 1, or larger than 1 for consideration of attenuation), and then the touch sensing signal VRX is sent at the common electrode 106, equivalently there is no voltage difference between the touch sensing electrode RX and the common electrode 106. In other words, the capacitance value of the background stray capacitance Crc may be reduced to minimum or zero. Refer to FIGS. 2B-2C, the background stray capacitance Crc connects the background stray capacitance Ctc in series, and accordingly the capacitance value of the series is reduced to minimum or zero. There is only the sensing capacitance Ctr between the touch driving electrode TX and the corresponding touch sensing electrode RX, making the touch receiver 140 able to sense the variation of the sensing capacitance Ctr more accurately.

Refer to FIG. 2D-2F, FIGS. 2D-2F show schematic views of mutual-capacitance touch sensing of the present invention, where the user has touched the mutual-capacitance touch device by finger. As shown in FIG. 2D, after the user touches the touch driving electrode TX by finger, the electric flux lines from the driving electrode to the sensing electrode is decrease, and the sensing capacitance Ctr becomes the touch sensing capacitance Ctrl. The variation of the capacitance is very small for the finger touching, thus the capacitance value of the touch sensing capacitance Ctrl is very close to that of sensing capacitance Ctr. Refer to FIGS. 2E-2F, and together with FIGS. 2B-2C, because capacitance values of background stray capacitance Ctc, Crc are close to or equal to zero, thus much smaller than that of the capacitance Ctr (much smaller than that of touch sensing capacitance Ctrl). By architectures of the present invention shown in FIGS. 2A-2F, the accuracy is greatly improved as to sense the capacitance variation resulted from the finger touching for the mutual-capacitance touch sensing device in embedded architecture.

Figure 5:
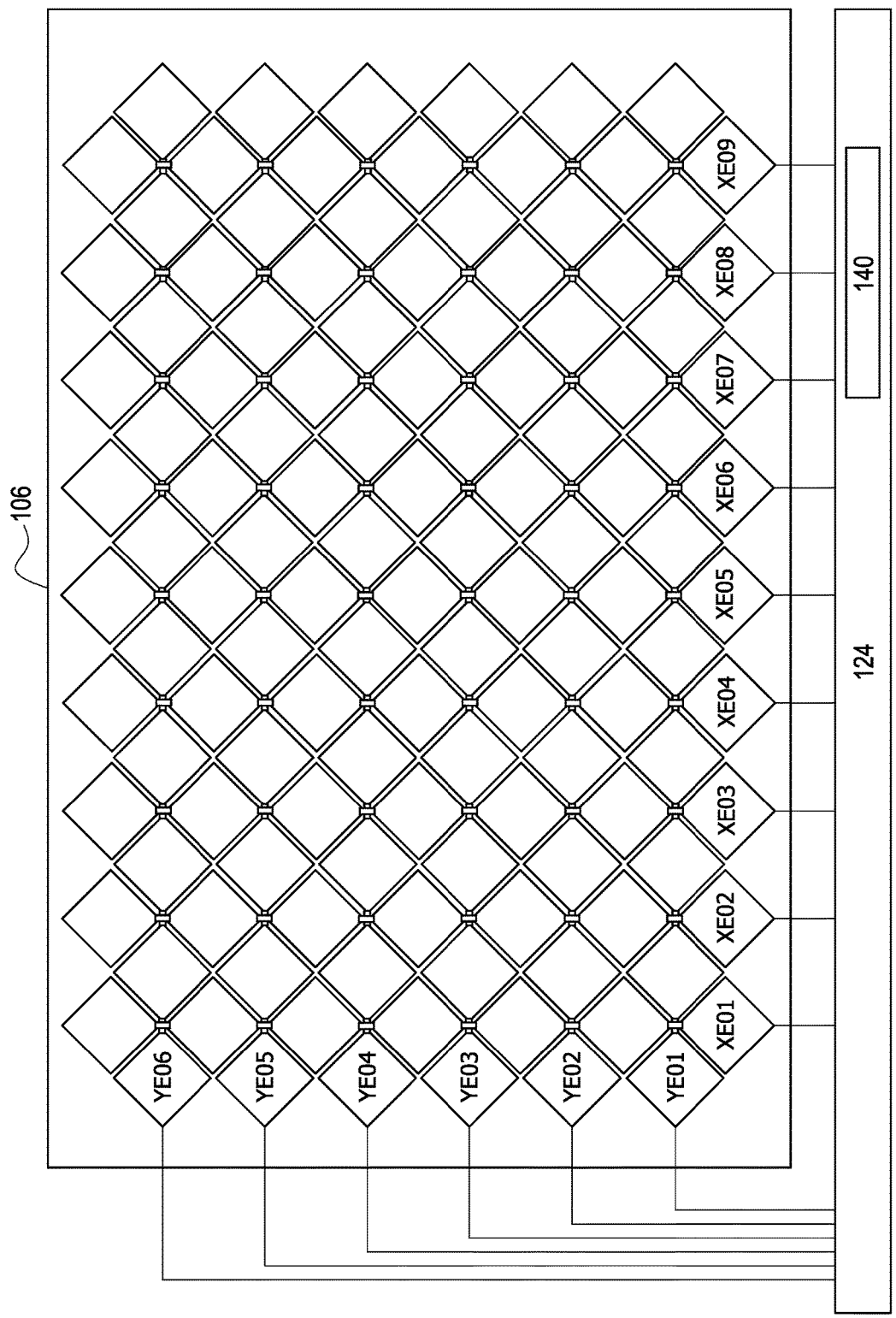
FIG. 5 shows a schematic view of a touch electrode distribution of a touch display apparatus adopting the highly sensitive mutual-capacitance touch sensing method of the present invention.
Figure 11A:
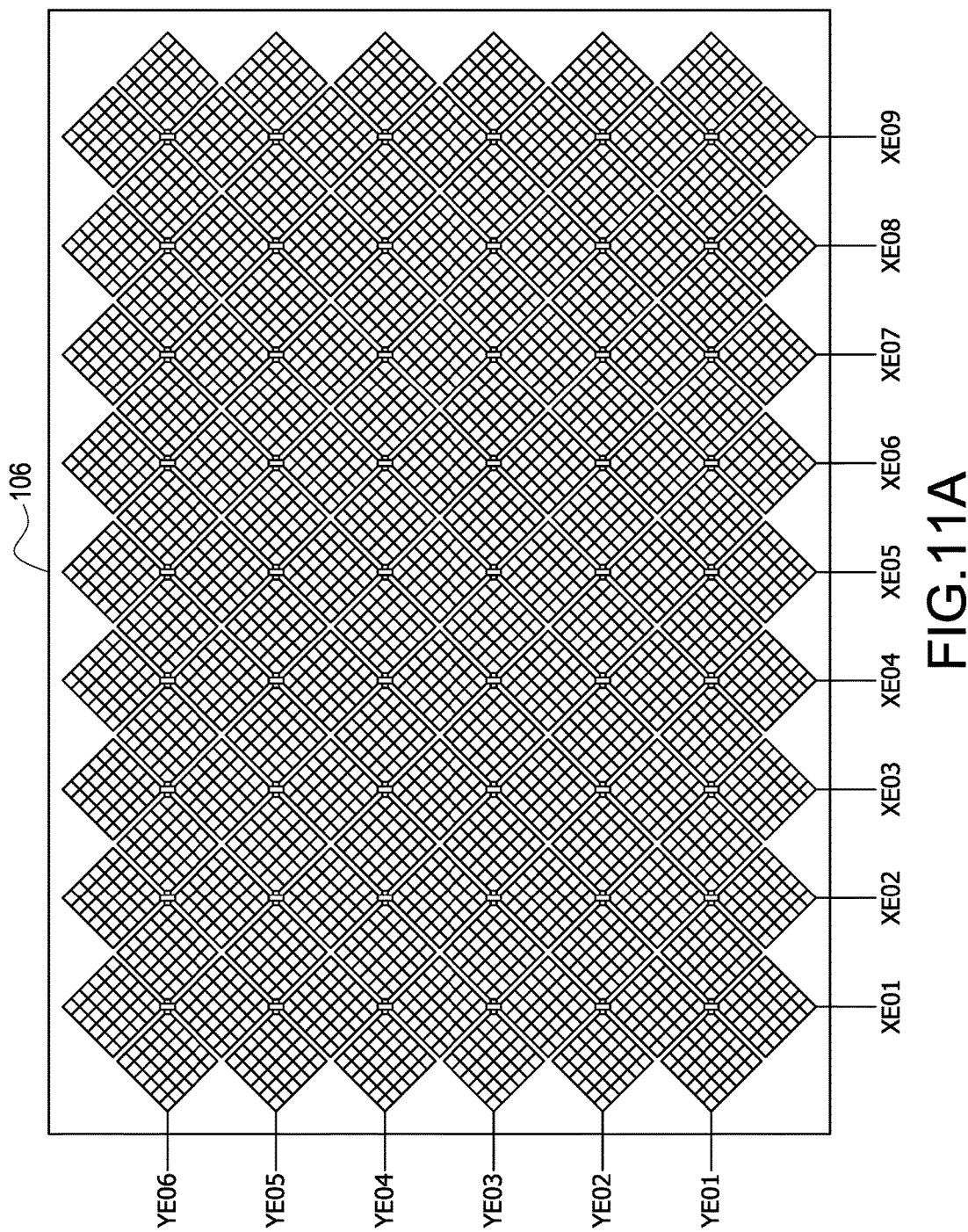
FIGS. 11A, 11B show schematic views of mutual-capacitance metal grid electrodes.

Refer to FIG. 3A, FIG. 3A shows a stack diagram of the touch display apparatus 10 adopting the highly sensitive mutual-capacitance touch sensing method of the present invention. The touch display apparatus 10 includes, from top to bottom, a touch protection layer 116, a touch electrode layer 112, a thin film encapsulation (TFE) layer 108, a common electrode layer 106, an organic light emitting material layer 104 and a thin film transistor substrate 102. The thin film transistor substrate 102 includes, from top to bottom, a pixel electrode layer 130, a thin film transistor layer 128 and a transistor substrate 126. The touch protection layer 116 is arranged on a side of the touch electrode layer 112, the side is opposite to the thin film encapsulation layer 108, and the touch protection layer 116 is a substrate or a cured coating layer, and may be made from polymer material such as glass, PI, PE, PET, etc. The touch electrode layer 112 may be made of transparent conductive material (such as ITO) or metal grid (such as metal grid touch electrode layer shown in FIG. 11A). The thin film encapsulation layer 108 also may be an upper substrate or protection layer (isolating water or air), and arranged between the touch electrode layer 112 and the common electrode layer 106. The common electrode layer 106 is arranged on the organic light emitting material layer 104 (such as organic emitting material layer), making the organic light emitting material layer 104 arranged between the common electrode layer 106 and the thin film transistor substrate 102. Refer to FIG. 5, FIG. 5 shows an implementation of the touch electrode layer 112 of the touch display apparatus 10 shown in FIG. 3A, the touch electrode layer 112 includes a plurality of second touch electrodes XE01-XE09 (arranged along the second direction) and a plurality of first touch electrodes YE01-06 (arranged along the first direction) coplanar with the second touch electrodes XE01-XE09, wherein the first direction is not parallel to the second direction, and may be almost perpendicular to the second direction. The second touch electrodes XE01-09 are respectively electrically connected by conductive bridges, the first touch electrodes YE01-06 are respectively electrically connected by conductive bridges, and there is an insulation layer (not shown) between the first touch electrodes YE01-06 and the second touch electrode XE01-09 thereon, to form electrical isolation between the second touch electrodes XE01-09 and the first touch electrodes YE01-06. The mutual-capacitance touch electrode layer 112 shown in FIG. 3A can be implemented by the above structure.

Figure 3B:
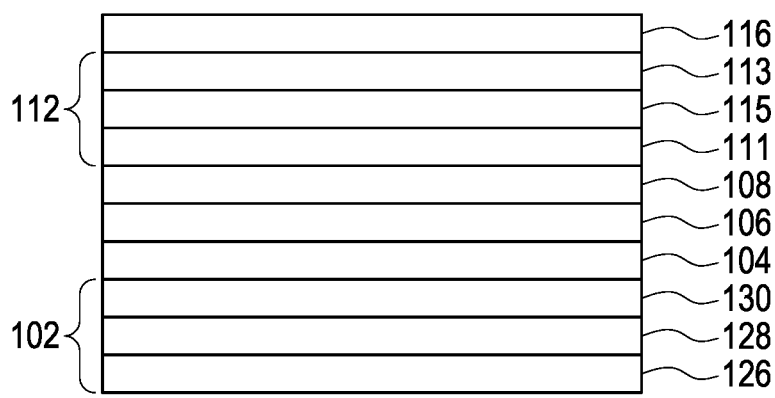
Figure 6:
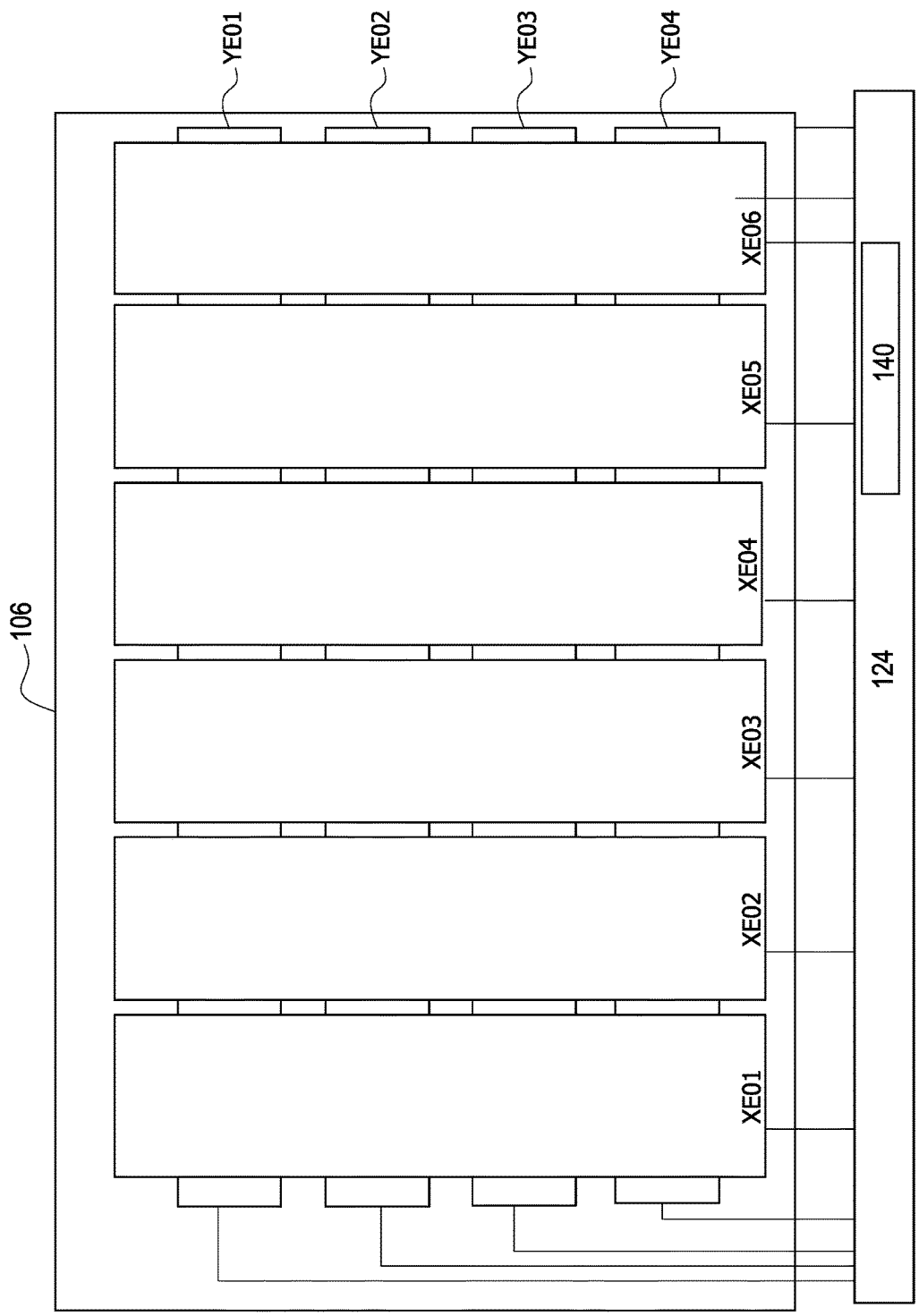
FIG. 6 shows a schematic view of another touch electrode distribution of a touch display apparatus adopting the highly sensitive mutual-capacitance touch sensing method of the present invention.
Figure 11B:
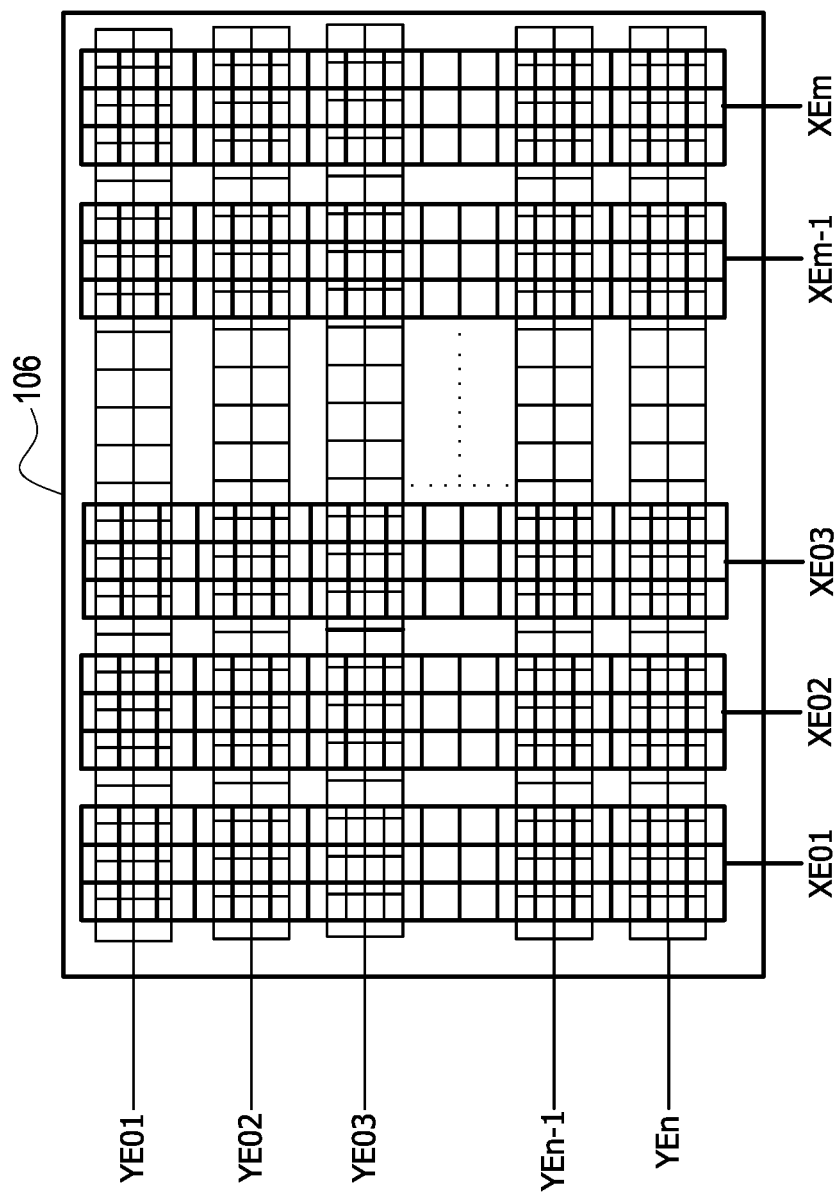

FIG. 3B shows a stack diagram of the touch display apparatus 10 according to another embodiment of the present invention. The touch electrode layer 112 includes, from top to bottom, a second touch electrode layer 113, an insulation layer 115 and a first touch electrode layer 111. Refer to FIG. 6, FIG. 6 shows an implementation of the touch electrode layer 112 corresponding to the embodiment shown in FIG. 3B. The second touch electrode layer 113 includes a plurality of second touch electrodes XE01-XE06 (arranged along the second direction), while the first touch electrode layer 111 includes a plurality of first touch electrodes YE01-04 (arranged along the first direction), wherein the first direction is not parallel to the second direction and may be almost perpendicular to the second direction. Moreover, the insulation layer 115 is formed between the first touch electrodes YE01-04 and the second touch electrodes XE01-06 shown in FIG. 6. The mutual-capacitance touch electrode layer 112 shown in FIG. 3B can be implemented by the above structure. The second touch electrode layer 113 and first touch electrode layer 111 may be made of transparent conductive material (such as ITO) or metal grid (such as dual metal grid touch electrode layers shown in FIG. 11B). The embodiments shown in FIGS. 3A and 3B above are, for example, touch display apparatus 10 for organic emitting.

Figure 9:
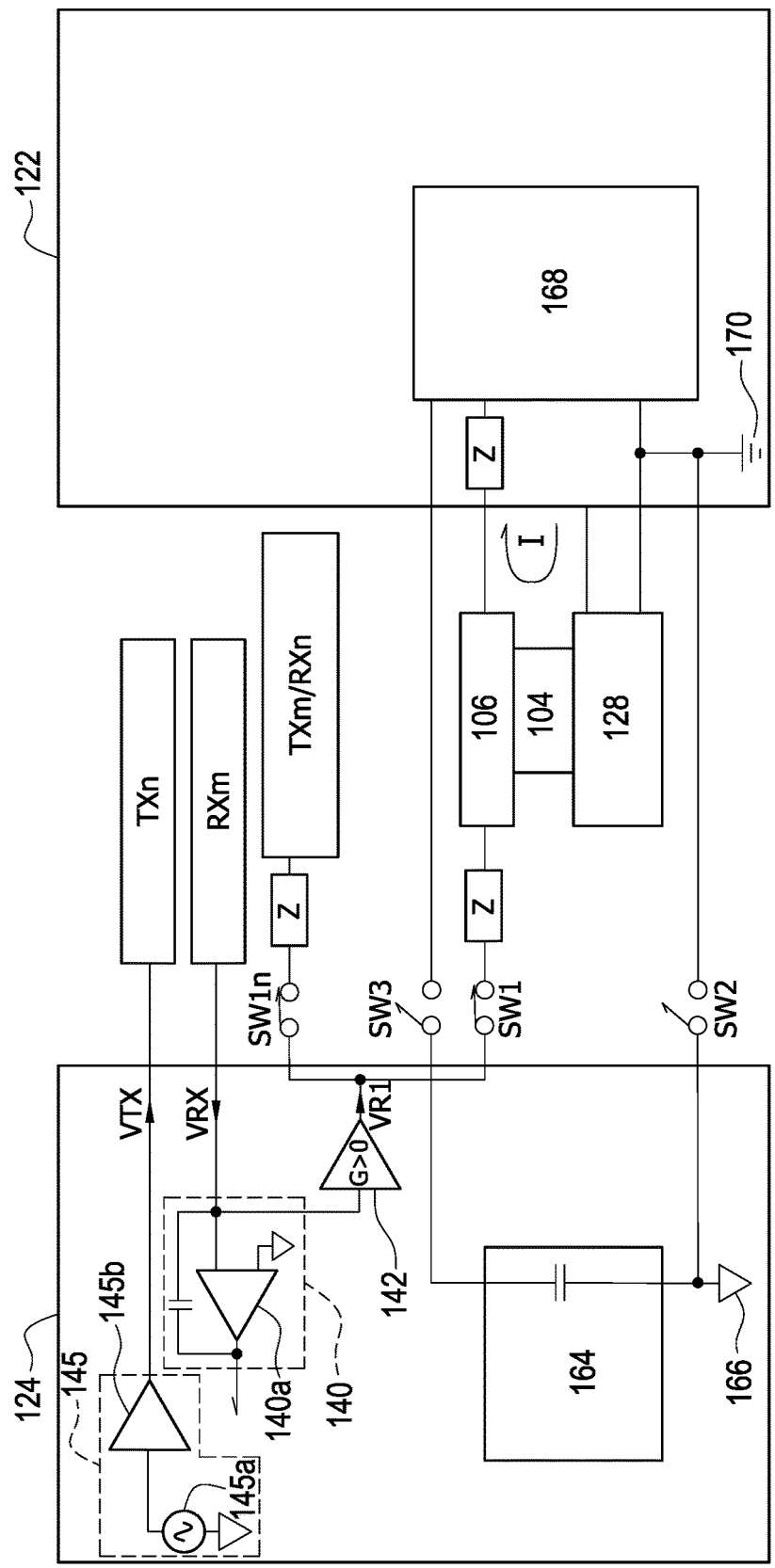
FIG. 9 is still another schematic view showing operation of highly sensitive mutual-capacitance touch sensing method of the present invention.
Figure 10A:
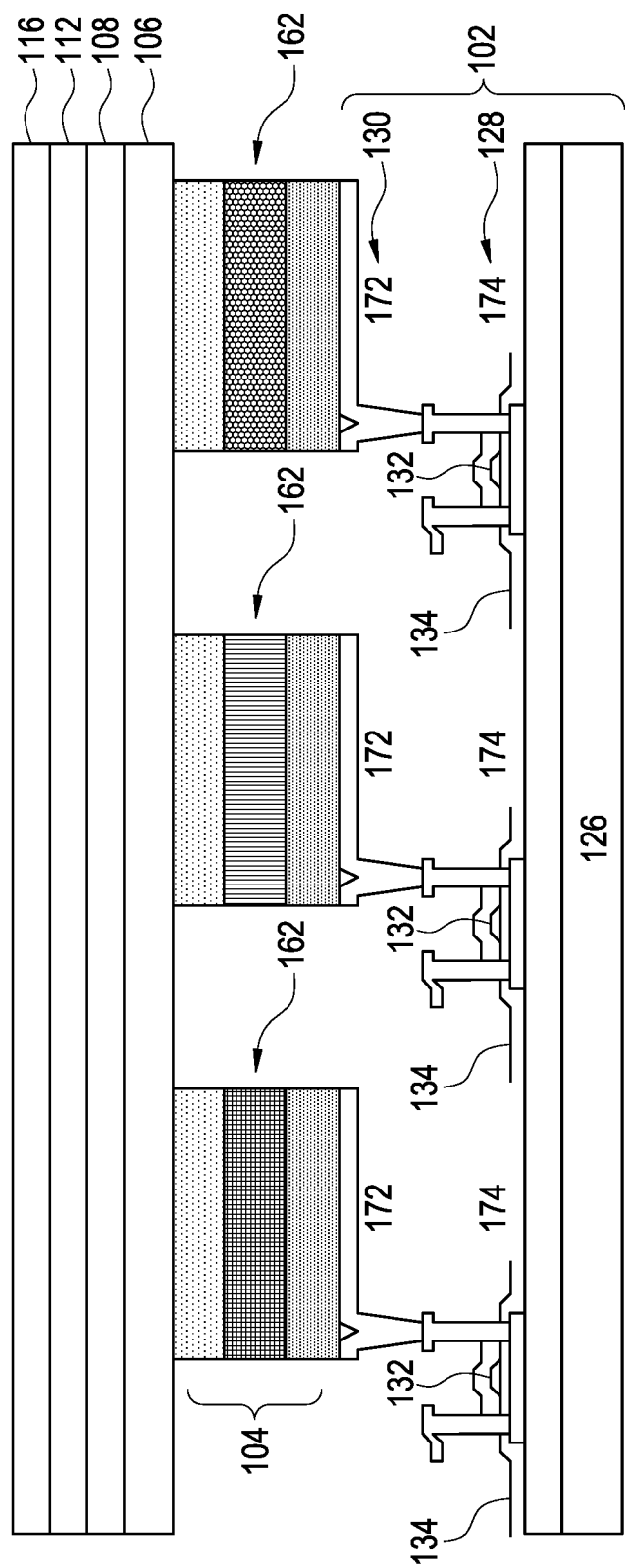
FIG. 10A shows a schematic view of detailed structure of an organic emitting display touch apparatus adopting the highly sensitive mutual-capacitance touch sensing method of the present invention.

Refer to FIG. 10A, FIG. 10A shows a detailed structural diagram corresponding to the embodiments shown in FIG. 3A and FIG. 5. As shown in FIG. 10A, the pixel electrode layer 130 includes a plurality of pixel electrodes 172; the thin film transistor layer 128 includes a plurality of thin film transistors 174. The pixel electrodes 172 are arranged correspond to the thin film transistors 174, the polarity of the pixel electrodes 172 is reverse to that of the common electrode layer 106 (that is, if the pixel electrodes 172 are anode, the common electrode layer 106 is cathode; if the pixel electrodes 172 are cathode, the common electrode layer 106 is anode). The thin film transistors 174 are arranged on the transistor substrate 126. The thin film transistor substrate 102 further includes a plurality of gate lines 132 and a plurality of data lines 134, where the gate lines 132 are electrically connected to the thin film transistors 174, the data lines 134 are electrically connected to the thin film transistors 174. Besides, the organic light emitting material layer 104 includes a plurality of organic light emitting materials 162. As shown in FIG. 9, the colors of the organic light emitting materials 162 are different from each other in the organic light emitting material layer 104, for example, the organic light emitting materials 162 are materials respectively emitting red light, green light, and blue light.

Figure 3C:
Figure 10B:
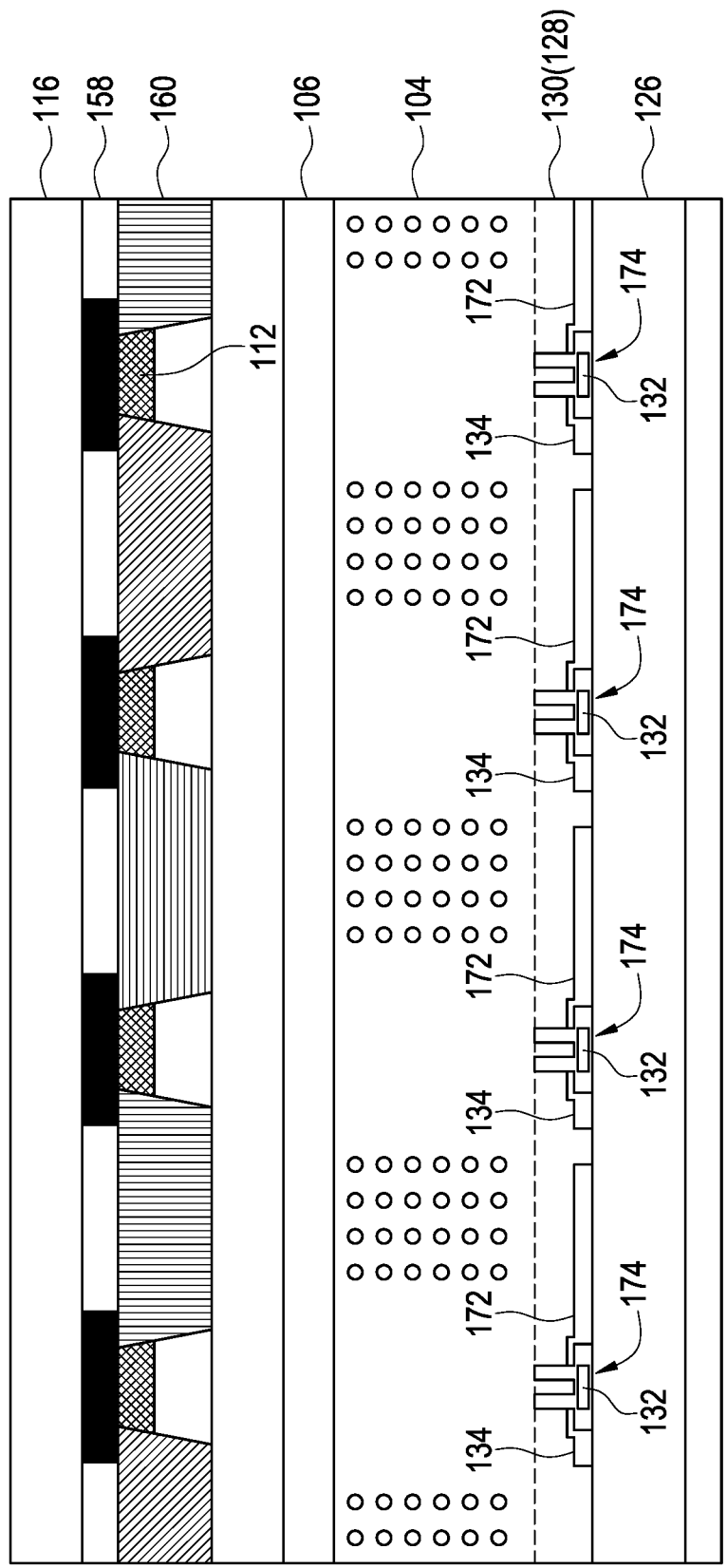
FIG. 10B shows a schematic view of detailed structure of a liquid crystal display touch apparatus adopting the highly sensitive mutual-capacitance touch sensing method of the present invention.

FIG. 3C shows a stack diagram of the touch display apparatus 10 according to another embodiment of the present invention. The touch display apparatus 10 includes, from top to bottom, a touch protection layer 116, a black matrix layer 158, a touch electrode layer 112, a color filtering layer 160, a common electrode layer 106, a display material layer 104 and a thin film transistor substrate 102. The thin film transistor substrate 102 includes, from top to bottom, a pixel electrode layer 130, a thin film transistor layer 128 and a transistor substrate 126. The display material layer 104 can be, for example, liquid crystal material layer, making the touch display apparatus 10 be touch display apparatus 10 of liquid crystal display. FIG. 10B shows a detailed structural diagram of the embodiment shown in FIG. 3C.

Figure 4A:
FIGS. 4A-4D show stack diagrams of touch display apparatuses adopting the highly sensitive mutual-capacitance touch sensing method of the present invention.
Figure 4B:
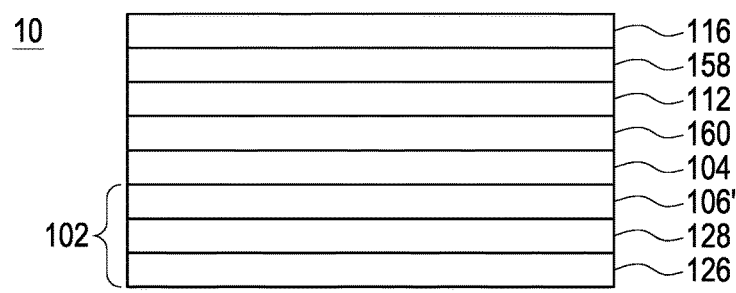

Refer to FIG. 4A, FIG. 4A shows a stack diagram of the touch display apparatus 10 adopting the highly sensitive mutual-capacitance touch sensing method according to another embodiment of the present invention. The structure of the touch display apparatus 10 is similar to that shown in FIG. 3C. However, positions of the touch electrode layer 112 and color filtering layer 160 are different. Besides, the pixel electrode layer of the embodiment shown in FIG. 4A is formed in the common electrode layer 106' (that is, pixel and common electrode layer 106'), to form touch display apparatus 10 of in-plane-switching (IPS) liquid crystal display. FIG. 4B shows a stack diagram of the touch display apparatus 10 adopting the highly sensitive mutual-capacitance touch sensing method according to another embodiment of the present invention. The structure of the touch display apparatus 10 is similar to that shown in FIG. 4A, however, the positions of the touch electrode layer 112 and color filtering layer 160 are exchanged. Similarly, the embodiment shown in FIG. 4B is touch display apparatus 10 of the IPS liquid crystal display.

Figure 4C:
Figure 4D:
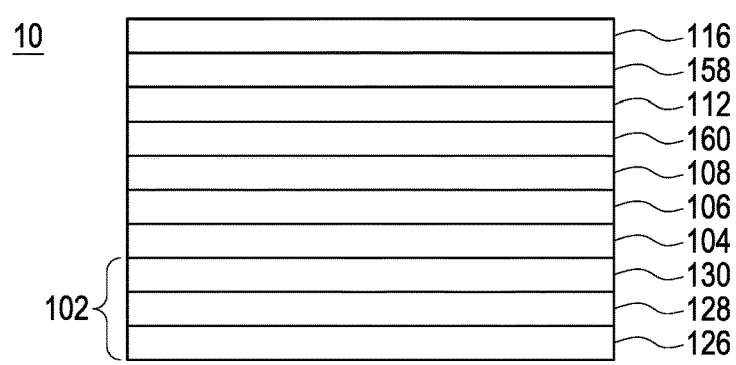

FIG. 4C shows a stack diagram of the touch display apparatus 10 adopting the highly sensitive mutual-capacitance touch sensing method according to another embodiment of the present invention. The structure of the touch display apparatus 10 is similar to that shown in FIG. 3A. However, the display material layer 104 (such as organic light emitting material layer 104) of the embodiment generates white light, thus additional black matrix layer 158 and color filtering layer 160 are needed. FIG. 4D shows a stack diagram of the touch display apparatus 10 adopting the highly sensitive mutual-capacitance touch sensing method according to another embodiment of the present invention. The structure of the touch display apparatus 10 is similar to that shown in FIG. 4C; however, the positions of the touch electrode layer 112 and black matrix layer 158 are exchanged. Similarly, the embodiments shown in FIGS. 4C and 4D are touch display apparatus 10 for organic light emitting.

Figure 7:
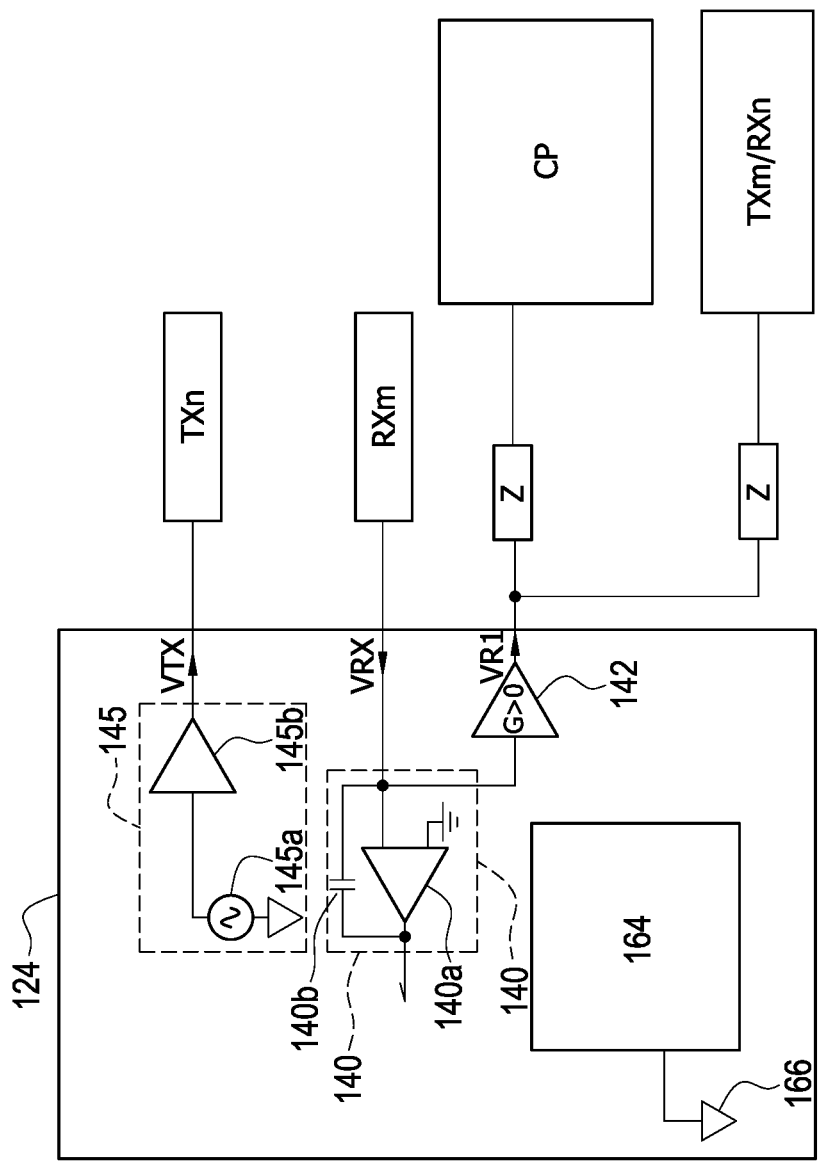
FIG. 7 is a schematic view showing operation of the highly sensitive mutual-capacitance touch sensing method of the present invention.

Refer to FIG. 7, FIG. 7 shows a schematic view of operation of the highly sensitive mutual-capacitance touch sensing method of the present invention. The mutual-capacitance touch apparatus according to the present invention can be implemented with embodiments shown in FIGS. 3A-3C, FIGS. 4A-4D, FIGS. 5-6, FIGS. 10A-10B. However, it can be known by skilled person in the field that, the highly sensitive mutual-capacitance touch sensing method still can be adopted by other mutual-capacitance touch apparatus. The mutual-capacitance touch apparatus according to the present invention at least includes a plurality of first touch electrodes TX (such as the touch electrodes YE01-YE04 shown in FIG. 6) arranged along the first direction, multiple second touch electrodes RX (such as the touch electrodes XE01-XE06 shown in FIG. 6) arranged along the second direction, and a touch controller 124. The touch controller 124 includes a touch driving signal generator 145 (including a touch driving signal source 145a and a driver circuit 145b), a touch receiver 140 (including an amplifier 140a and a capacitance 140b), an amplifier 142 with a gain larger than zero. Besides, the mutual-capacitance touch apparatus further includes a touch power source 164 and a touch grounded end 166. During touch sensing operation, the driver circuit 145b sequentially or randomly applies a touch driving signal VTX to selected second touch electrode TXn, and senses a touch sensing signal VRX at a corresponding first touch electrode RXm by the touch receiver 140. The touch controller 124 processes the touch sensing signal VRX by the amplifier with gain larger than zero, then generates a reference signal VR1, and applies the reference signal VR1 to conductor CP close to the second touch electrode. The conductor CP may be a common voltage electrode of liquid crystal display, a common cathode or common anode of an organic light emitting display, a casing of touch apparatus, and a shielding electrode of the touch apparatus. Besides, it also can be a power source output point of the display controller 122 of a touch display apparatus, a grounded point, a node of the dc loop, or output point of a display signal driving stage; or non-selected second touch electrode RXn or non-selected first touch electrode TXm.

Refer to FIGS. 2A-2F together, a reference signal VR1 is applied at a conductor (such as the common electrode 106) close to the second touch electrode RX, the reference signal is obtained by processing the touch sensing signal VRX by the amplifier 142 with a gain larger than zero, thus background stray capacitance between the selected second touch electrode RX and the conductor can be eliminated equivalently, to improve accuracy of touch sensing. Moreover, the mutual-capacitance touch display apparatus 10 has different structures, the conductor close to the second touch electrode may also be a casing of the touch display apparatus, a shielding electrode or non-selected first (second) touch electrode of the touch display apparatus.

Figure 8:
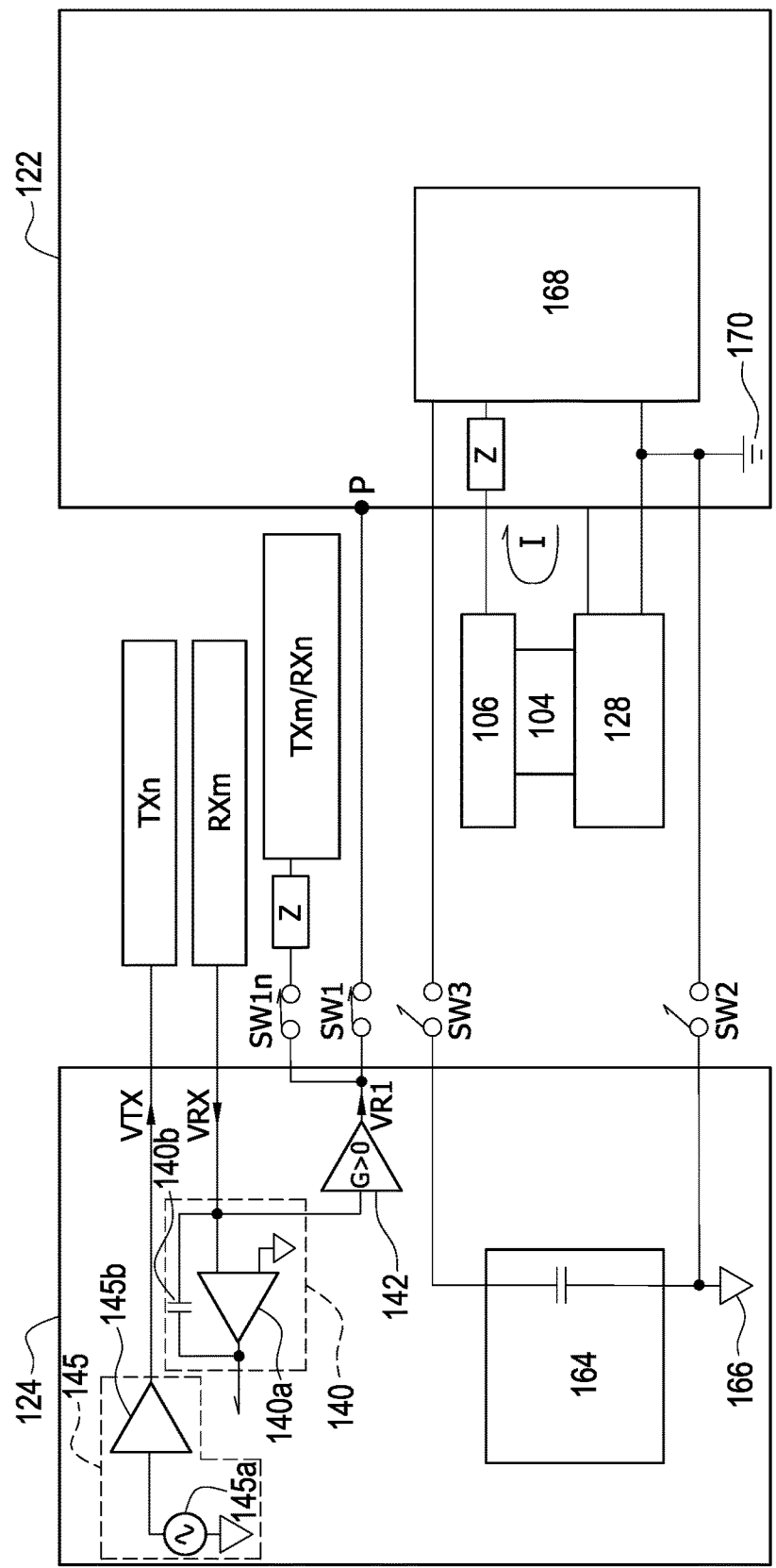
FIG. 8 is another schematic view showing operation of the highly sensitive mutual-capacitance touch sensing method of the present invention.

Refer to FIG. 8, FIG. 8 shows a schematic view of operation of the highly sensitive mutual-capacitance touch sensing method according to another embodiment of the present invention. Compared with FIG. 7, the mutual-capacitance touch display apparatus 10 further includes a display controller 122, a display power source 168, a display grounded end 170 and a plurality of impedances Z. Besides, the touch display apparatus 10 further includes a first switch set (including first switches SW1, SW1n) connected between the amplifier 142 and the display power source 168, and connected between the amplifier 142 and non-selected first (second) touch electrode, a second switch SW2 connected between the touch grounded end 166 and the display grounded end 170, and a third switch SW3 connected between the touch power source 164 and the display power source 168.

During touch sensing operation, the driver circuit 145b sequentially or randomly applies a touch driving signal to a selected first touch electrode TXn, and senses a touch sensing signal VRX at a corresponding second touch electrode RXm by the touch receiver 140. The touch controller 124 processes the touch sensing signal VRX by the amplifier 142 with a gain larger than zero to generate a reference signal VR1, and transmits the reference signal VR1 through the first switch SW1 (turned on) to a reference point P of the display controller 122, the reference point can be a power source output point of the display controller 122, a node of the dc loop thereof, a grounded point of the display controller 122 or an output point of a driving stage of the display controller 122. Moreover, the touch controller 124 may also transmit the reference signal VR1 through the first switch SW1n (turned on) to non-selected first (second) touch electrode TXm/RXn. Besides, during touch sensing operation, the second switch SW2 and the third switch SW3 are turned off. Because there is only a single physical connection point (connected by the first switch SW1) between the display controller 122 and the touch controller 124, and the touch grounded end 166 and the display grounded end 170 are different grounded ends, thus there is no common current loop between the display controller 122 and the touch controller 124, and the noise of the display controller 122 is prevented from influencing measuring of the touch controller 124. Moreover, similar to aforementioned effect, processing the touch sensing signal VRX by the amplifier 142 with a gain larger than zero, and then transmitting the touch sensing signal VRX by first switch SW1 to a reference point P of the display controller 122 (or transmitting the signal to the common electrode 106 by the display power source 168 and an impedance Z), this can reduce background stray capacitance between the selected second touch electrode RXm and an adjacent conductor nearby, thus improving accuracy of touch sensing. Besides, with reference to FIG. 8 together, the reference signal VR1 is also transmitted through the first switch SW1n (turned on) to non-selected first (second) touch electrode TXm/RXn, to further eliminate background stray capacitance between the selected second touch electrode TXn/RXm and non-selected first (second) touch electrode TXm/RXn. If not during the touch sensing operation, the first switches SW1, SW1n may also be turned off, and the second switch SW2 and third switch SW3 may be turned on, to charge the touch power source 164 with the display power source 168.

Refer to FIG. 9, FIG. 9 is a schematic view showing operation of the highly sensitive mutual-capacitance touch sensing method according to an embodiment of the present invention. Compared with FIG. 8, the amplifier 142 of the touch display apparatus 10 with gain larger than zero is connected to the common electrode 106 through a first switch SW1. Similarly, the amplifier 142 of the mutual-capacitance touch display apparatus 10 with a gain larger than zero is connected to non-selected first (second) touch electrode TXm/RXn by another first switch SW1n. The touch grounded end 166 is connected to display grounded end 170 by a second switch SW2. The touch power source 164 is connected to display power source 168 by a third switch SW3. Similarly, during touch sensing operation, the driver circuit 145b sequentially or randomly applies a touch driving signal VTX to a selected first touch electrode TXn, and senses a touch sensing signal VRX at a corresponding selected second touch electrode RXm by the touch receiver 140. The touch controller 124 further processes the touch sensing signal VRX by the amplifier 142 with gain larger than zero, and then generates a reference signal VR1, and transmits the reference signal VR1 to the common electrode 106 through the first switch SW1 (turned on). Moreover, touch controller 124 may also transmit the reference signal VR1 through the first switch SW1n (turned on) to non-selected first (second) touch electrode TXm/RXn. Besides, during touch sensing operation, the second switch SW2 and the third switch SW3 are turned off. Because there is only a single physical connection point (connected by the first switch SW1) between the display controller 122 and the touch controller 124, and the touch grounded end 166 and the display grounded end 170 are different grounded ends, thus there is no common current loop between the display controller 122 and the touch controller 124, and the noise of the display controller 122 is prevented from influencing measurement of the touch controller 124. Moreover, similar to aforementioned effect, processing the touch sensing signal VRX by the amplifier 142 with a gain larger than zero, and then transmitting the touch sensing signal VRX through first switch SW1 to the common electrode 106, this can reduce background stray capacitance between the second touch electrode RXm and a conductor nearby, thus improving accuracy of touch sensing. If not during the touch sensing operation, the first switch SW1 may also be turned off, and the second switch SW2 and third switch SW3 may be turned on, to charge the touch power source 164 with the display power source 168.

Moreover, in the embodiments shown in FIGS. 7-9, the touch controller 124 successively adjusts the gain of the amplifier with predetermined increments or decrements according to the touch sensing signal inputted, to obtain an optimal touch sensing signal. For example, during calibration of the touch display apparatus (before shipped out of factory or while being used), it can be presumed that the amplifier 142 of the touch controller 124 has a gain of 1. Afterward, the gain of the amplifier 142 is adjusted with a predetermined increment (such as amplifications of 1.2, 1.4, 1.6, etc.), and then a touch sensing signal corresponding to a predetermined touch point is tested (for example, sensing a touch sensing signal corresponding to a touch position, which the touch display apparatus already instructs the user to touch), to determine an optimized gain. Moreover, the touch controller 124 can also preset the gain of the amplifier 142 to be one and then adjusts the gain the amplifier 142 with predetermined decrements (such as amplifications of 0.9, 0.8, 0.7, etc.). Afterward, a touch sensing signal corresponding to a predetermined touch point is tested (for example, sensing a touch sensing signal corresponding to a touch position, which the touch display apparatus already instructs the user to touch), to determine an optimized gain.

Besides, the aforementioned calibration may also be performed automatically by computer of factory, after the touch display apparatus is manufactured. In other words, a processor (not shown) may control the touch controller 124 to change the gain of the amplifier 142 in above-mentioned manners, and applies the generated reference signal VR1 to at least an adjacent conductor near the second touch electrode. The adjacent conductor may be a common voltage electrode of liquid crystal display, a common cathode or common anode of an organic light emitting display, a casing of the touch display apparatus, and a shielding electrode of the touch display apparatus. The adjacent conductor may also be a grounded point, a node of dc loop thereof, a power source output point of the display controller, or output point of a display signal driving stage, or non-selected second touch electrode or non-selected first touch electrode. The processor may determine an optimized gain according to the calibration, and determine specific adjacent conductors for different second touch electrodes (the reference signal VR1 is to be applied to the adjacent conductor). The second touch electrodes may have different specific adjacent conductors, there may be more than one adjacent conductor, and there may be different gains for different second touch electrodes and the corresponding specific adjacent conductors. Accordingly, the touching of the touch display apparatus can be optimized, and noise from the display panel structure is decreased.

Thus, particular embodiments have been described. Other embodiments are within the scope of the following claims. For example, the actions recited in the claims may be performed in a different order and still achieve desirable results.

What is claimed is:

1. A highly sensitive mutual-capacitance touch sensing method comprising:
 (a) providing a touch apparatus, the touch apparatus comprising:
  a plurality of first touch electrodes arranged along a first direction;
  a plurality of second touch electrodes arranged along a second direction, wherein the first direction is different from the second direction; and
  a touch controller comprising:
   a touch driving signal generator;
   a touch receiver; and
   an amplifier with gain larger than zero; and
 (b) the touch controller sequentially or randomly applying a touch driving signal to a selected first touch electrode, and sensing a touch sensing signal at a second touch electrode by the touch receiver, and processing the touch sensing signal by the amplifier with gain larger than zero, then outputting the processed touch sensing signal to at least a conductor close to the second touch electrode and a reference point of a display controller;
 wherein the amplifier with gain larger than zero is arranged outside the touch receiver;
 wherein the touch sensing signal is sent to the touch receiver through a first path and the touch sensing signal is sent to the amplifier with gain larger than zero through a second path different from the first path,
 wherein there is only one physical connection point between the display controller and the touch controller during a touch sensing operation, and wherein the reference point of the display controller is a power source output point of the display controller, a grounded point of the display controller, a node of a dc loop of the display controller of the display controller, or an output point of a driving stage of the display controller.

2. The method of claim 1, wherein the conductor close to the second touch electrode is a common voltage electrode of a liquid crystal display, a common cathode or common anode of an organic light emitting display.

3. The method of claim 1, wherein the conductor close to the second touch electrode is a casing of the touch apparatus.

4. The method of claim 1, wherein the conductor close to the second touch electrode is a shielding electrode of the touch apparatus.

5. The method of claim 1, wherein the conductor close to the second touch electrode is a non-selected first touch electrode or non-selected second touch electrode.

6. The method of claim 1 further comprising:
the touch controller successively increasing or decreasing a gain of the amplifier by a predetermined increment or decrement according to the inputted touch sensing signal to obtain an improved touch sensing signal.

7. A highly sensitive mutual-capacitance touch sensing method comprising:
(a) providing a touch display apparatus, the touch display apparatus comprising:
a plurality of first touch electrodes arranged along a first direction;
a plurality of second touch electrodes arranged along a second direction, wherein the first direction is different from the second direction;
a transistor substrate;
a thin film transistor layer comprising a plurality of thin film transistors, a plurality of data lines and a plurality of gate lines;
a plurality of pixel electrodes electrically connected to the thin film transistors;
a display material layer being arranged on a side of the plurality of pixel electrodes, the side being opposite to the transistor substrate;
at least a common electrode;
a display controller comprising a display power source;
a touch controller comprising:
a touch power source;
a touch driving signal generator generating a touch driving signal; and
a touch receiver and an amplifier with gain larger than zero; and
(b) the touch controller sequentially or randomly applying the touch driving signal to a selected first touch electrode, and sensing a touch sensing signal at a second touch electrode by the touch receiver, and processing the touch sensing signal by the amplifier with gain larger than zero, then outputting the processed touch sensing signal to at least a conductor close to the second touch electrode and a reference point of the display controller,
wherein the display controller and the touch controller have no common current loop therebetween during touch sensing operation;
wherein the amplifier with gain larger than zero is arranged outside the touch receiver;
wherein the display power source and the touch power source have different grounds,
wherein there is only one physical connection point between the display controller and the touch controller during touch sensing operation, and
wherein the reference point of the display controller is a power source output point of the display controller, a grounded point of the display controller, a node of a dc loop of the display controller of the display controller, or an output point of a driving stage of the display controller.

8. The method of claim 7, wherein the display material layer is a liquid crystal material layer.

9. The method of claim 7, wherein the display material layer is an organic light emitting material layer, the pixel electrode is a pixel anode or pixel cathode, the common electrode is a common cathode or common anode.

10. The method of claim 7, wherein the display controller and the touch controller have a common current loop therebetween during non-touch-sensing operation.

11. The method of claim 7, further comprising:
the touch controller successively increasing or decreasing the gain of the amplifier by a predetermined increment or decrement according to the inputted touch sensing signal to obtain an improved touch sensing signal.

12. A mutual-capacitance touch display apparatus comprising:
a plurality of first touch electrodes arranged along a first direction;
a plurality of second touch electrodes arranged along a second direction, wherein the first direction is different from the second direction;
a transistor substrate;
a thin film transistor layer comprising a plurality of thin film transistors, a plurality of data lines and a plurality of gate lines;
a plurality of pixel electrodes being electrically connected to the thin film transistor;
a display material layer being arranged on a side of the plurality of pixel electrodes, the side being opposite to the transistor substrate;
a common electrode layer;
a display controller comprising a display power source; and
a touch controller comprising:
a touch power source;
a touch driving signal generator generating a touch driving signal; and
a touch receiver and an amplifier with gain larger than zero;
wherein the touch controller sequentially or randomly applies the touch driving signal to a selected first touch electrode, and senses a touch sensing signal at a second touch electrode by the touch receiver, and processes the touch sensing signal by the amplifier with gain larger than zero, then outputs the processed touch sensing signal to at least a conductor close to the second touch electrode and a reference point of the display controller;
wherein the display controller and the touch controller have no common current loop therebetween during touch sensing operation,
wherein the display power source and the touch power source have different grounds,
wherein there is only one physical connection point between the display controller and the touch controller during touch sensing operation, and
wherein the reference point of the display controller is a power source output point of the display controller, a grounded point of the display controller, a node of a dc loop of the display controller of the display controller, or an output point of a driving stage of the display controller.

13. The mutual-capacitance touch display apparatus of claim 12, wherein the display material layer is a liquid crystal material layer.

14. The mutual-capacitance touch display apparatus of claim 12, wherein the display material layer is an organic light emitting material layer, the pixel electrode is a pixel anode or pixel cathode, the common electrode is a common cathode or common anode.

15. The mutual-capacitance touch display apparatus of claim 12, wherein the display controller and the touch controller have a common current loop therebetween during non-touch-sensing operation.

16. The mutual-capacitance touch display apparatus of claim 12, wherein the touch controller is configured to successively increase or decrease the gain of the amplifier by a predetermined increment or decrement according to the inputted touch sensing signal to obtain an improved touch sensing signal.

* * * * *